(12) United States Patent
Jeong et al.

(10) Patent No.: US 7,632,028 B2
(45) Date of Patent: Dec. 15, 2009

(54) SUBSTRATE TRANSFER APPARATUS

(75) Inventors: Chun-Seok Jeong, Suwon-si (KR);
Ho-Youn Park, Suwon-si (KR);
Sok-Joo Lee, Yongin-Si (KR);
Seung-Won Lee, Yongin-Si (KR)

(73) Assignee: DMS Co., Ltd., Suwon (KR)

( * ) Notice: Subject to any disclaimer, the term of this patent is extended or adjusted under 35 U.S.C. 154(b) by 0 days.

(21) Appl. No.: 12/323,807

(22) Filed: Nov. 26, 2008

(65) Prior Publication Data
US 2009/0190109 A1 Jul. 30, 2009

(30) Foreign Application Priority Data
Jan. 28, 2008 (KR) .................. 10-2008-0008523

(51) Int. Cl.
G03D 5/00 (2006.01)
G03D 5/04 (2006.01)

(52) U.S. Cl. .................. 396/611; 396/612; 396/615; 396/624

(58) Field of Classification Search .................. 396/604, 396/611, 612, 615, 624, 627, 631
See application file for complete search history.

(56) References Cited

U.S. PATENT DOCUMENTS

| 5,223,881 A * | 6/1993 | Nakagawa et al. | 396/570 |
| 2002/0191976 A1* | 12/2002 | Nozawa et al. | 396/612 |
| 2004/0125187 A1* | 7/2004 | Kosaka et al. | 347/102 |

* cited by examiner

*Primary Examiner*—Alan A Mathews
(74) *Attorney, Agent, or Firm*—Gifford, Krass, Sprinkle, Anderson & Citkowski, P.C.

(57) ABSTRACT

A substrate transfer apparatus that is designed provide an inclined transfer function that improves liquid saving efficiency of a process solution (developing solution) during the transfer of the substrate. The substrate transfer apparatus includes a first transfer unit for transferring a substrate, a second transfer unit spaced apart from an end of the first transfer unit, a third transfer unit disposed between the first and second transfer units and providing an inclined transfer that is capable of saving a developing solution adhered to the substrate during transfer of the substrate, and a transfer controller for controlling an inclined transfer angle and a connection state of the third transfer unit.

15 Claims, 11 Drawing Sheets

SUBSTRATE TRANSFER APPARATUS

CROSS-REFERENCE TO RELATED APPLICATIONS

This application claims priority to and the benefit of Korean Patent Application No. 10-2008-0008523 filed in the Korean Intellectual Property Office on Jan. 28, 2008, the entire contents of which are incorporated herein by reference.

BACKGROUND OF THE INVENTION

1. Field of the Invention

The present invention relates to a substrate transfer apparatus that is used in a wet developing process for manufacturing a substrate of a flat display device. More particularly, the present invention relates to a substrate transfer apparatus that is designed to provide an inclined transfer function that improves liquid saving efficiency of a process solution (developing solution) during the transfer of the substrate.

2. Description of the Related Art

A photolithography process is generally used to form a circuit pattern on a substrate of a flat display device. The photolithography process includes a wet developing process for developing an exposed resist layer on the substrate using a developing solution.

The wet developing process includes a process for applying the developing solution to the resist layer of the exposed substrate, a process for cleaning the substrate, and a process for drying the substrate. These processes are sequentially performed during the transfer of the substrate from a first side to a second side in a chamber by a transfer apparatus.

The transfer apparatus is generally provided in the form of a roller conveyer type that transfers the substrate by rotation of transfer rollers and has an inclined transfer section for liquid saving to improve recovery and recycling efficiencies of the developing solution during the transfer of the substrate.

Korean laid-open patent No. 10-2007-0093343 (filed in 2007) discloses a substrate treatment apparatus having an inclined transfer section for saving the liquid.

The substrate treatment apparatus of the laid-open patent has an inclined transfer section between developing and cleaning sections of an entire substrate transfer section. The inclined transfer section is designed such that, when the substrate comes out of the developing section, the substrate is transferred along an upwardly inclined transfer section and, when the substrate goes into the cleaning section, the substrate is transferred along a downwardly inclined transfer section.

When the inclined transfer section for saving the liquid is defined in the entire transfer section, remaining developing solution on the substrate runs off as the substrate is transferred along the upwardly inclined transfer section, thereby being recovered to a developing chamber.

Therefore, the inclined transfer section increases the recovery rate of the developing solution during die developing process and prevents the cleaning solution from being polluted by excessive flow of the developing solution into the cleaning chamber.

However, since the substrate treatment apparatus disclosed in the laid-open patent No. 10-2007-0093343 is structured such that transfer rollers located at the inclined transfer section are integrally coupled to the chamber, the following problems may occur during the developing process.

For example, since an inclined angle and connection state of the inclined transfer section cannot be properly adjusted in response to the size of the substrate and the working environment (developing speed), working compatibility is deteriorated.

Particularly, when the inclined angle of the inclined transfer section is not properly adjusted in response to the size of the substrate and the working environment, it is difficult to expect a sufficient liquid saving effect during the inclined transfer of the substrate.

Hence, the recovery rate of the developing solution is deteriorated and thus the consumption of the developing solution increases. In addition, since an excessive amount of the developing solution is mixed with the cleaning solution, the recycling rate of the cleaning solution is significantly reduced.

When the substrate goes into or comes out of the inclined transfer section, a front end of the substrate may be easily put between the rollers or contact the rollers, and thus the substrate may be damaged or its position may be changed. This causes the substrate to be transferred in an abnormal state where the position of the substrate changes or the substrate is damaged.

When the substrate is abnormally transferred as described above, the cleaning solution or drying air is non-uniformly supplied to a treating surface of the substrate during the cleaning process or drying process, and thus the cleaning and drying qualities may be deteriorated.

The above information disclosed in this Background section is only for enhancement of understanding of the background of die invention and therefore it may contain information that does not form the prior art that is already known in this country to a person of ordinary skill in the art.

SUMMARY OF THE INVENTION

The present invention has been made in an effort to provide a substrate transfer apparatus that is designed to stably transfer a substrate for a developing process, and that has an inclined transfer function that can improve liquid saving efficiency of a processing solution (developing solution) during transfer of the substrate.

An exemplary embodiment of the present invention provides a substrate transfer apparatus includes: a first transfer unit for transferring a substrate; a second transfer unit spaced apart from an end of the first transfer unit; a third transfer unit disposed between the first and second transfer units and providing an inclined transfer section that is capable of saving a developing solution adhered to the substrate during transfer of the substrate; and a transfer controller for controlling an inclined transfer angle and a connection state of the third transfer unit.

According to the exemplary embodiment of the present invention, since the third transfer unit providing the inclined transfer section for the fluid saving is provided between the first and second transfer units, the substrate can be transferred to the second chamber unit in a state where the developing solution is saved in the first chamber unit.

Particularly, since the third transfer unit is formed as a non-fixed, variable type that can be properly controlled in an incline angle and connection state by the transfer controller, an optimal inclined transfer section can be provided in response to the size of the substrate and the working environment (developing speed) during the developing process.

DETAILED DESCRIPTION OF THE PREFERRED EMBODIMENTS

The present invention will be described more fully hereinafter with reference to the accompanying drawings, in which exemplary embodiments of the invention are shown.

As those skilled in the art would realize, the described embodiments may be modified in various different ways, all without departing from the spirit or scope of the present invention.

Figure 1:
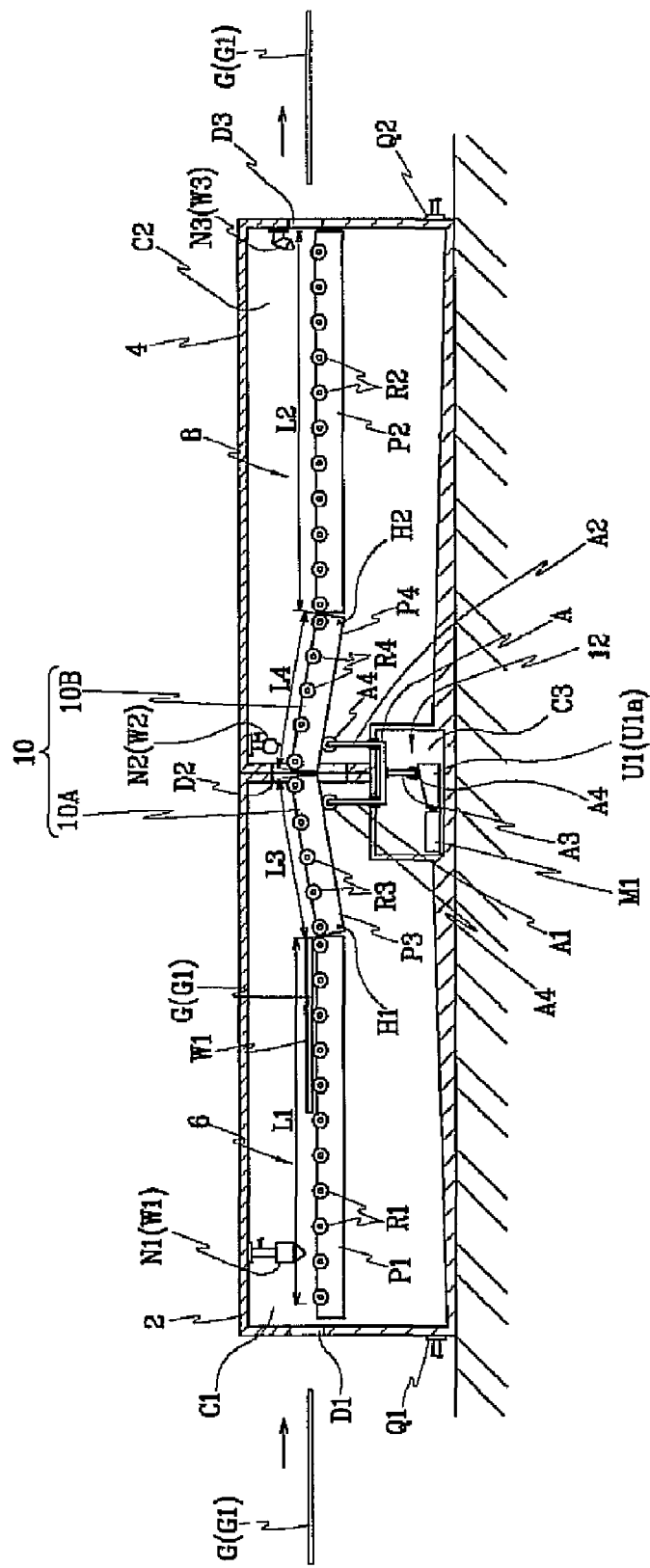
FIG. 1 is a schematic view of a substrate transfer apparatus according to an exemplary embodiment of the present invention.

FIG. 1 is a schematic view of a substrate transfer apparatus according to an exemplary embodiment of the present invention. Reference numerals 2 and 4 indicate a first chamber unit and a second chamber unit, respectively.

The first chamber unit 2 is provided in the form of a box-shaped chamber case defining a first chamber C1 having a predeterminned volume.

The second chamber unit 4 is provided in the form of a box-shaped chamber case defining a second chamber C2 having a predetermined volume.

The first and second chamber units 2 and 4 are arranged at left and right sides with reference to FIG. 1 such that respective first surfaces thereof abut each other and are provided with openings D1, D2, and D3 through which the substrate G passes from the left side to the right side.

First, second, and third fluid supplying units N1, N2, and N3 are located in the first and second chamber units 2 and 4.

The first fluid supplying unit N1 is for supplying a developing solution W1 and the second fluid supplying unit N1 is for supplying a cleaning solution W2. The third fluid supplying unit N3 is for supplying drying air W3.

That is, the first, second, and third fluid supplying units N1, N2, and N3 are formed in a typical structure (slit nozzle, air knife) for wet-developing a resist layer G1 of the substrate G by respectively receiving the developing solution W1, cleaning solution W2, and drying air W3 from respective fluid tanks (not shown).

Bottoms of the first and second chambers C1 and C2 are respectively connected to drain pipes Q1 and Q2 through which the developing solution W1 and cleaning solution W2 supplied to the substrate G are discharged.

The first and second chamber units 2 and 4 may be formed by two independent chamber cases as shown in FIG. 1. Alternatively, the first and second chamber units 2 and 4 may be formed by dividing an inner space of one chamber case into two spaces each having a predetermined volume.

The substrate transfer apparatus according to the exemplary embodiment of the present invention further includes first and second transfer units 6 and 8 that are respectively installed to correspond to the first and second chamber units 2 and 4.

As shown in FIG. 1, the first and second transfer units 6 and 8 are provided in the form of a typical roller conveyer type having support brackets P1 and P2 and a plurality of transfer rollers R1 and R2 that are spaced apart from each other and installed on the support brackets P1 and P2.

When a motor (not shown) is driven, the transfer rollers R1 and R2 receive power from a typical chain/sprocket (not shown) or belt/belt pulley (not shown) to rotate about an axis.

According to the above-described structure, horizontal transfer sections L1 and L2 where the substrate G is transferred from the left side to the right side with reference to FIG. 1 by the first and second transfer units 6 and 8 in the first and second chambers C1 and C2 are provided.

Therefore, the developing solution W1, the cleaning solution W2, and the drying air W3 are sequentially supplied to the treating surface of the substrate G during the transfer of the substrate G in the first and second chamber units 2 and 4.

Meanwhile, the substrate transfer apparatus of the exemplary embodiment of the present invention further includes a third transfer unit 10.

The third transfer unit 10 is for providing a variable inclined transfer section for the liquid saving between the first and second transfer units 6 and 8. The third transfer unit 10 includes a first variable transfer unit 10A and a second variable transfer unit 10B.

As shown in FIG. 1, the first and second variable transfer units 10A and 10B are provided in the form of a typical roller conveyer type having support brackets P3 and P4 and a plurality of transfer rollers R3 and R4 that are spaced apart from each other and supported on the brackets P3 and P4.

The first and second variable transfer units 10A and 10B are set to synchronize with the first and second transfer units 6 and 8. Alternatively, the first and second variable transfer units 10A and 10B may be driven by a separate driving unit such as a motor, a chain/sprocket, and a belt/pulley. An ordinary person in the art can easily perform the above-described driving method and thus a detailed description thereof will be omitted herein.

Figure 2:
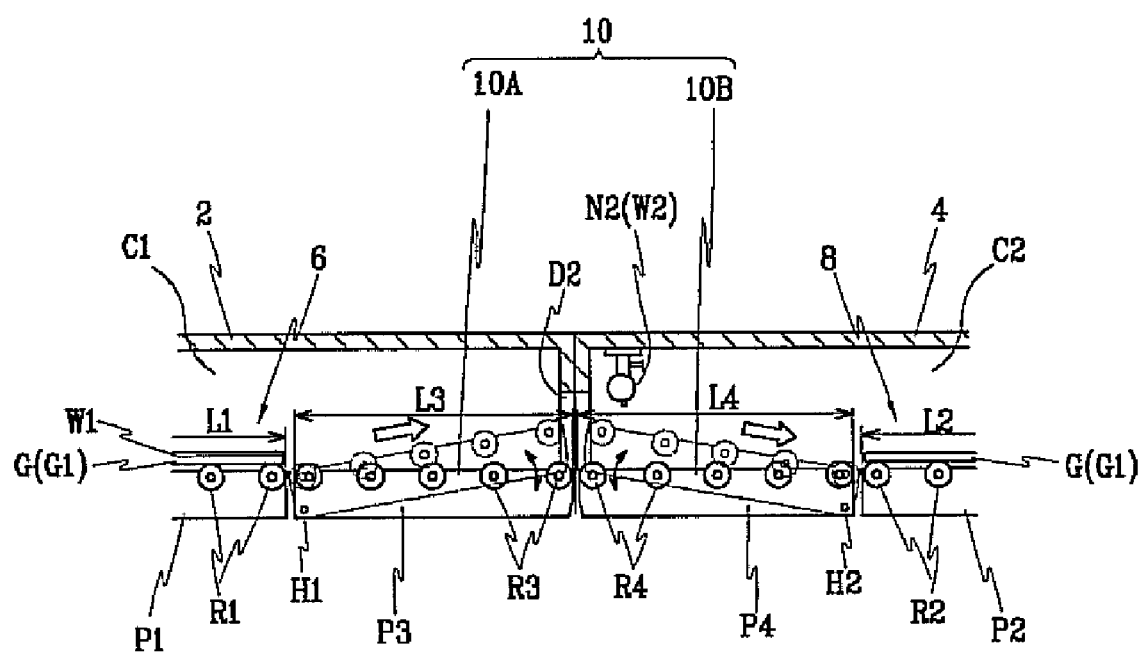
FIG. 2 is a schematic view of a third transfer unit depicted in FIG. 1.

Referring to FIG. 2, the first variable transfer unit 10A is located to correspond to a first end of the first transfer unit 6 and the second variable transfer unit 10B is located to correspond to a first end of the second transfer unit 8.

Therefore, the substrate G can be transferred between the first and second transfer units 6 and B that are respectively located at the left and right sides with reference to the opening D2 formed at a boundary portion of the first and second chamber units 2 and 4.

First ends of the support brackets P3 and P4 of the first and second variable transfer units 10A and 10B are hinge-coupled to the first and second chamber units 2 and 4 by hinge shafts H1 and H2.

According to the above-described structure, as shown in FIG. 2, by pivoting the support brackets P3 and P4 about the hinge coupling points, the first variable transfer unit 10A may be adjusted to be inclined upward and the second variable transfer unit 10B may be adjusted to be inclined downward.

Therefore, two variable transfer sections L3 and L4 where the developing solution W1 can be saved when the substrate G is transferred from the boundary portion of the first and second chamber units 2 and 4 to the first and second variable transfer units 10A and 10B can be provided.

The substrate transfer apparatus according to the exemplary embodiment of the present invention further includes a transfer controller 12.

Figure 3:
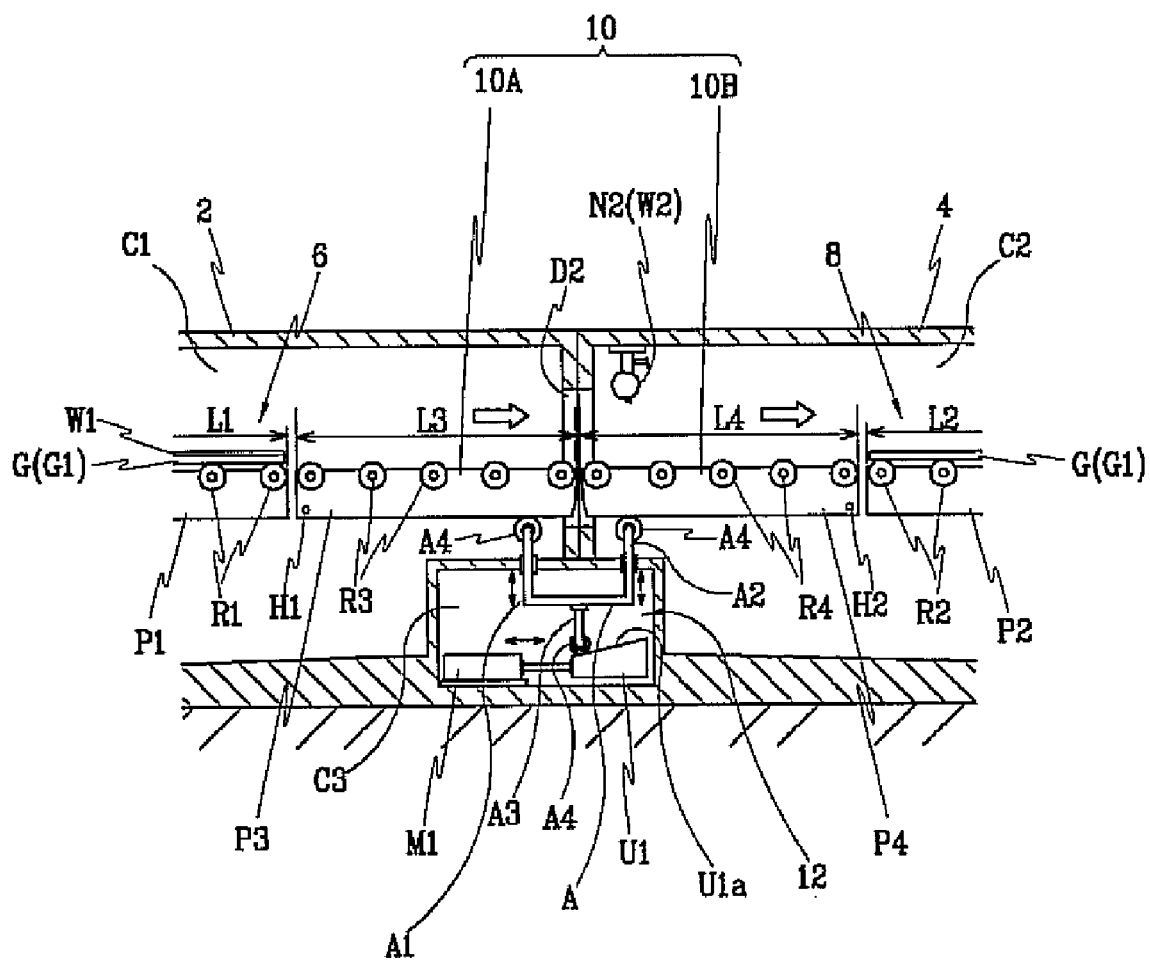
FIGS. 3 and 4 are schematic views illustrating a structure and operation of a transfer controller depicted in FIG. 1.

The transfer controller 12 is for properly controlling the inclined angles and connection state of the first and second variable transfer units 10A and 10B of the third transfer unit 10. As shown in FIG. 3, the transfer controller 12 includes a driving source M1 and a push arm A that moves up and down by the driving source M1.

A typical cylinder may be used as the driving source M1. The driving source M1 may be installed in a sub-chamber C3 defined in the second chamber unit 4.

The sub-chamber C3 may be isolated from the first and second chambers C1 and C2 so that the developing solution W1 or the cleaning solution W2 cannot be introduced therein.

As shown in FIG. 3, the push arm A is provided at an upper portion with two support ends A1 and A2 and at a lower portion with a connection end A3. The push arm A is supported such that it is fitted through a surface (top surface) of the sub-chamber C3 to be capable of moving up and down.

The push arm A is set to receive power through a typical cam U1 motion and move up and down when the cylinder of the driving source M1 is driven.

That is, the support ends A1 and A2 of the push arm A are located to support sides of the bottoms of the support brackets P3 and P4 of the first and second variable transfer units 10A and 10B. The connection end A3 is disposed such that it contacts a cam surface U1a of the cam U1 as shown in FIG. 3.

The cam U1 is fixed on a piston rod end of the cylinder of the driving source M1. The cam surface U1a may be inclined upward from the left side to the right side with reference to FIG. 3.

The support ends A1 and M2 and the connection end A3 may be provided with respective ground contact rollers A4. When the ground contact rollers A4 are installed, the friction can be reduced when the two support ends A1 and A2 contact and support the support brackets P3 and P4 of the first and second variable transfer units 10A and 10B or when the connection end A3 contacts the cam surface U1a.

That is, when the driving source M1 is driven, the push arm A receives the power through a typical cam motion and moves up and down to allow the two support ends A1 and M2 to push the first and second variable transfer units 10A and 10B.

Figure 4:
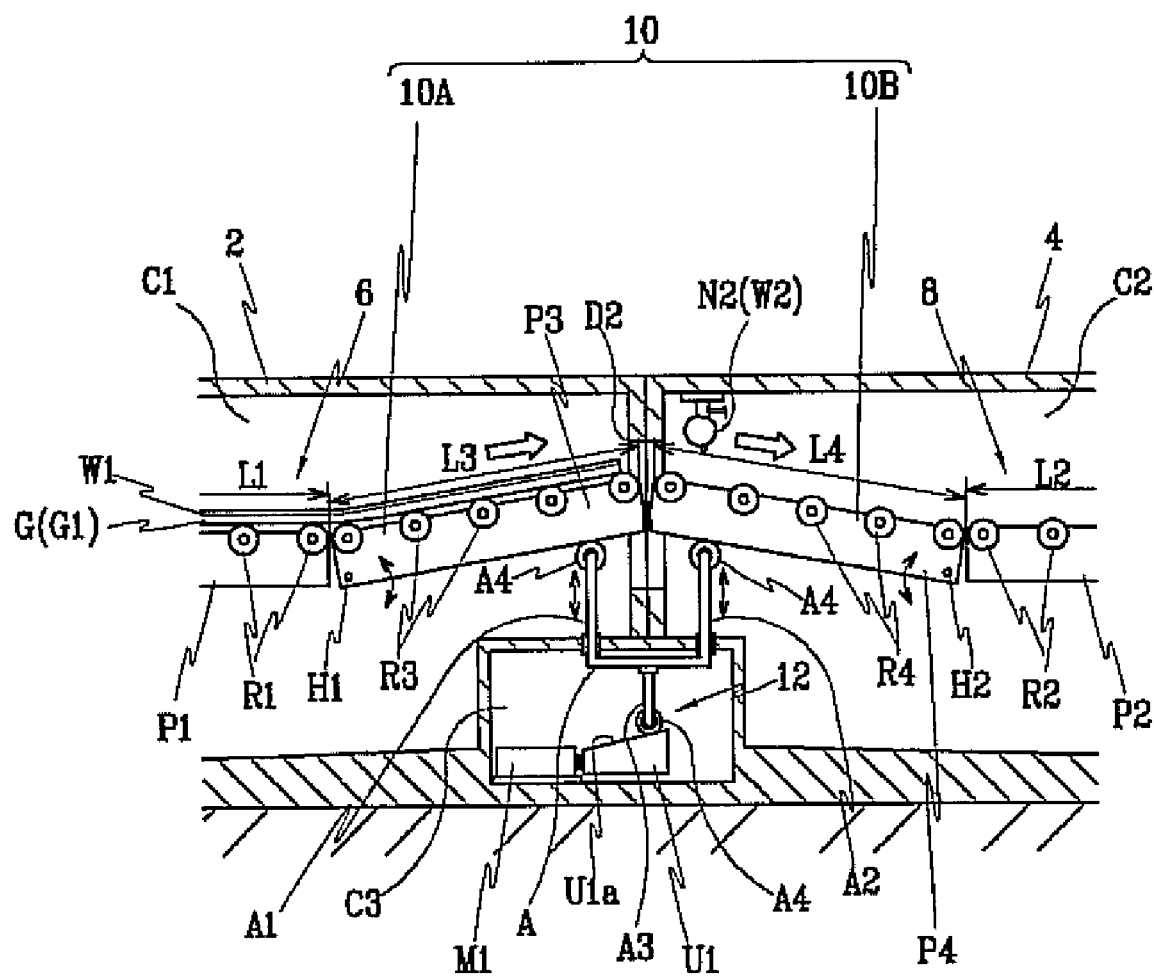

Therefore, the transfer controller 12 pivots the first and second variable transfer units 10A and 10B about their hinge points by the pushing operation of the push arm A so as to provide the variable transfer sections L3 and L4 inclined upward or downward as shown in FIG. 4, thereby making it possible to save the developing solution W1 during the transfer of the substrate G.

Particularly, since the transfer controller 12 can control the inclined angles and connection state of the first and second variable transfer units 10A and 10B while adjusting an up/down transfer pitch of the push arm A using the cam U1, the working compatibility can be further improved as compared with the case where the inclined angle of the inclined transfer section is fixed.

Although not shown in the drawings, the transfer controller 12 may be installed at an outer side of the first and second chamber units 2 and 4 such that the above-described operation can be realized. The transfer controller 12 may be set to move up and down while directly pushing or pulling the push arm A using the piston rod of the cylinder but without using the cam.

Figure 5:
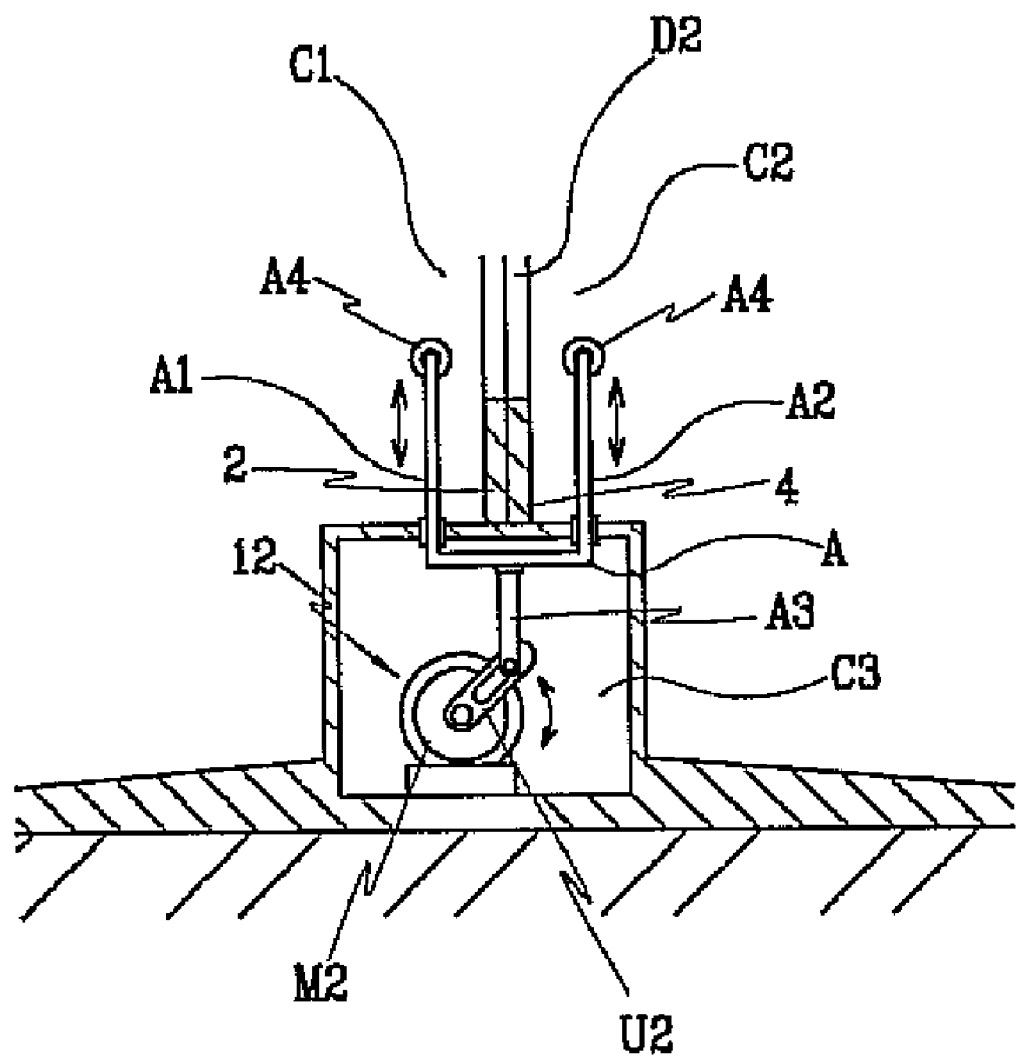
FIG. 5 is a schematic view of a modified example of the transfer controller of FIGS. 3 and 4.

FIG. 5 is a schematic view of a modified example of the transfer controller of FIGS. 3 and 4. In this modified example, a link U2 is used to transfer power.

A typical step motor is used as a driving source M2 and a shaft of the step motor M2 is fixed to a first end of the link U2. A second end of the link U2 is connected to the connection end A3 of the push arm A through a protrusion/groove engagement.

According to the above-described structure, when the step motor of the driving source M2 rotates the link U2 in both directions at a predetermined angle, the push arm A can move up and down through a typical two-link motion.

Therefore, the push arm A moves up and down through the two-link motion, and the inclined angle and connection state of the third transfer unit 10 can be properly controlled by the support ends A1 and A2.

The transfer controller 12 is not limited to a power transmission method using the cam motion or the link motion.

For example, although not shown in the drawings, the push arm A may be set to move up and down by the forward/reverse rotation of a screw connected to the motor shaft. In addition, a variety of other power transmission and generation structures that can properly control the inclined transfer angle and connection state of the third transfer unit 10 are within the scope of the present invention.

In the previous description, the inclined angles and connection state of the first and second variable transfer units 10A and 10B are simultaneously controlled by one transfer controller 12. However, the present invention is not limited to this configuration.

Figure 6:
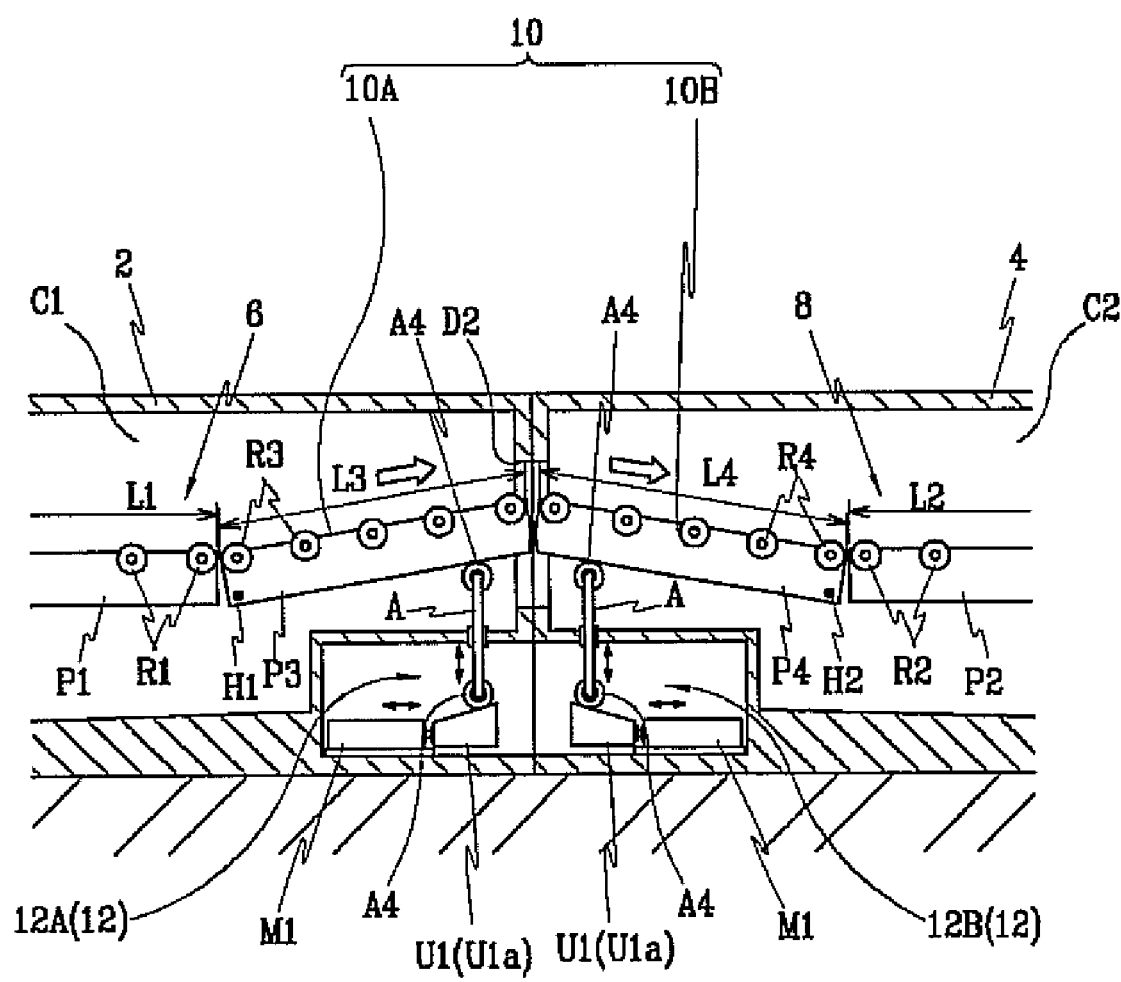
FIG. 6 is a schematic view of a modified example of the transfer controller of FIGS. 3 and 4.

For example, as shown in FIG. 6, two transfer controllers 12A and 12B may be installed to correspond to the first and second variable transfer units 10A and 10B, respectively.

According to this structure, the inclined angles and connection state of the first and second variable transfer units 10A and 10B can be independently controlled in the first and second chamber units 2 and 4.

Figure 7:
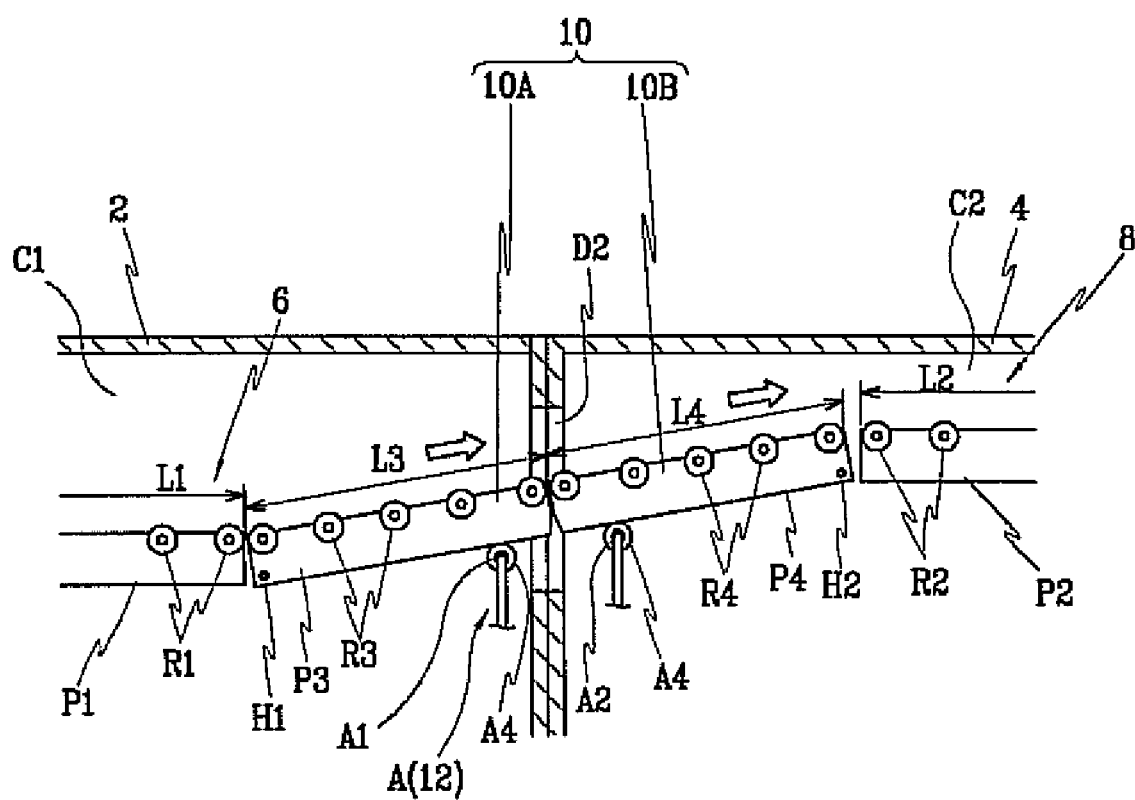
FIGS. 7 to 9 are schematic views of a modified example of a third transfer unit depicted in FIG. 1.

FIG. 7 is a schematic view of a modified example of the third transfer unit 10. In this modified example, the horizontal transfer sections L1 and L2 may be provided between the first and second transfer units 6 and 8 having different heights.

That is, a first end of the first variable transfer unit 10A is correspondingly hinge-coupled to a first end of the first transfer twit 6 and a first end of the second variable transfer unit 10B is correspondingly hinge-coupled to a first end of the second transfer unit 8.

As shown in FIG. 7, the support ends A1 and A2 of the push arm A are set such that heights thereof are slightly different from each other and they individually or commonly move up and down.

According to this structure, by properly moving up and down the push arm A, the variable transfer sections L3 and L4 may be formed such that they are inclined upward by the first and second variable transfer units 10A and 10B.

Figure 8:
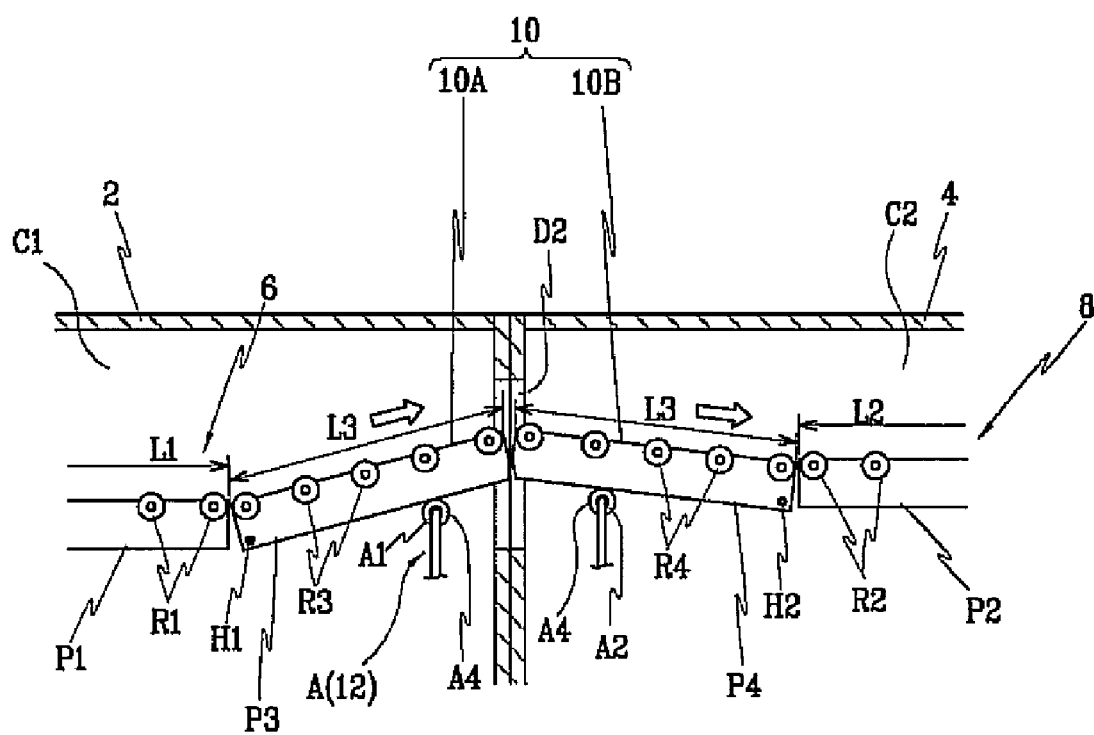

In this state, when the push arm A moves slightly further up, the first variable transfer unit 10A forms the variable transfer section L3 that is inclined upward as shown in FIG. 8 and the second variable transfer unit 10B forms the variable transfer section L4 that is inclined downward.

Figure 9:
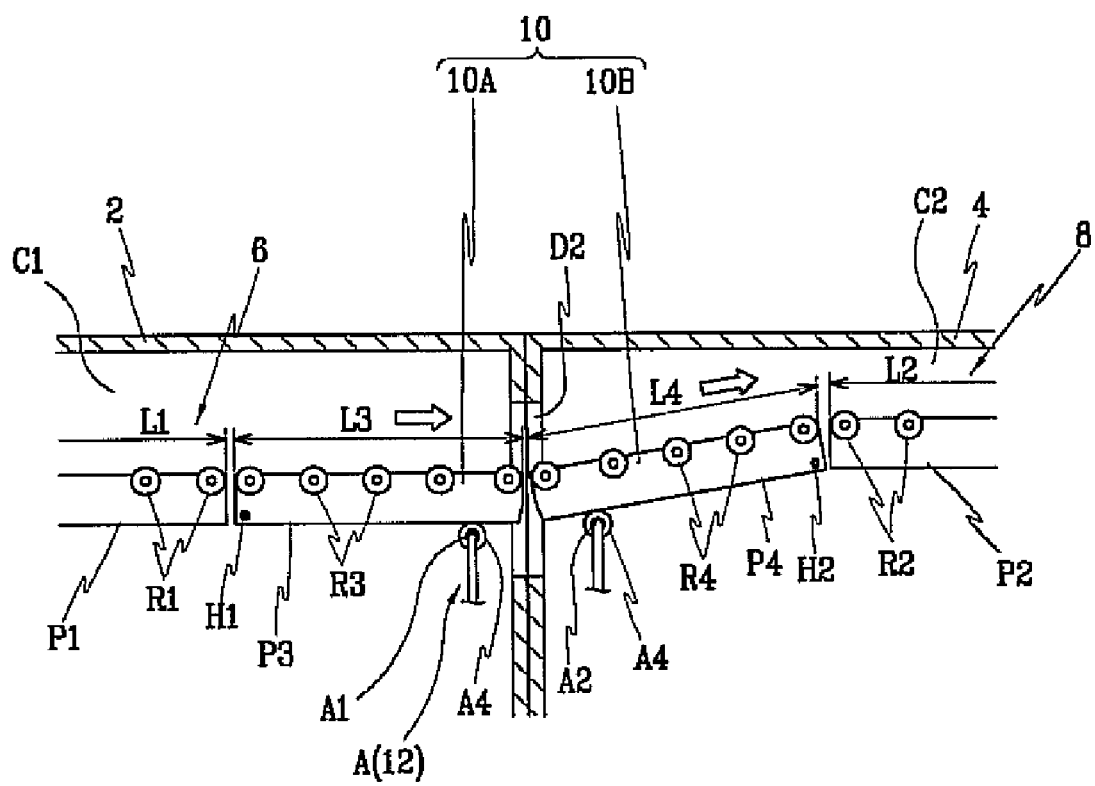

In addition, by properly moving the push arm A up and down, the first variable transfer unit 10A may form the variable transfer section L3 that is roughly horizontal as shown in FIG. 9 and the second variable transfer unit 10B may form the variable transfer section L4 that is incline upward.

Accordingly, the substrate transfer apparatus according to the exemplary embodiment of the present invention can perform a variety of inclined transfer work for saving the developing solution W1 as the transfer controller 12 controls the incline angle and connection state of the third transfer unit 10 during the developing process.

The substrate transfer apparatus according to the exemplary embodiment of the present invention may further include a transfer guide member 14.

A rubber belt or rubber ring having a predetermined width may be used as the transfer guide member 14. The transfer guide member 14 is set in the transfer section of the substrate G such that the substrate G can be effectively transferred.

For example, the transfer guide member 14 may be set near the first variable transfer unit 10A corresponding to the first transfer unit 6 in the third transfer unit 10.

Figure 10:
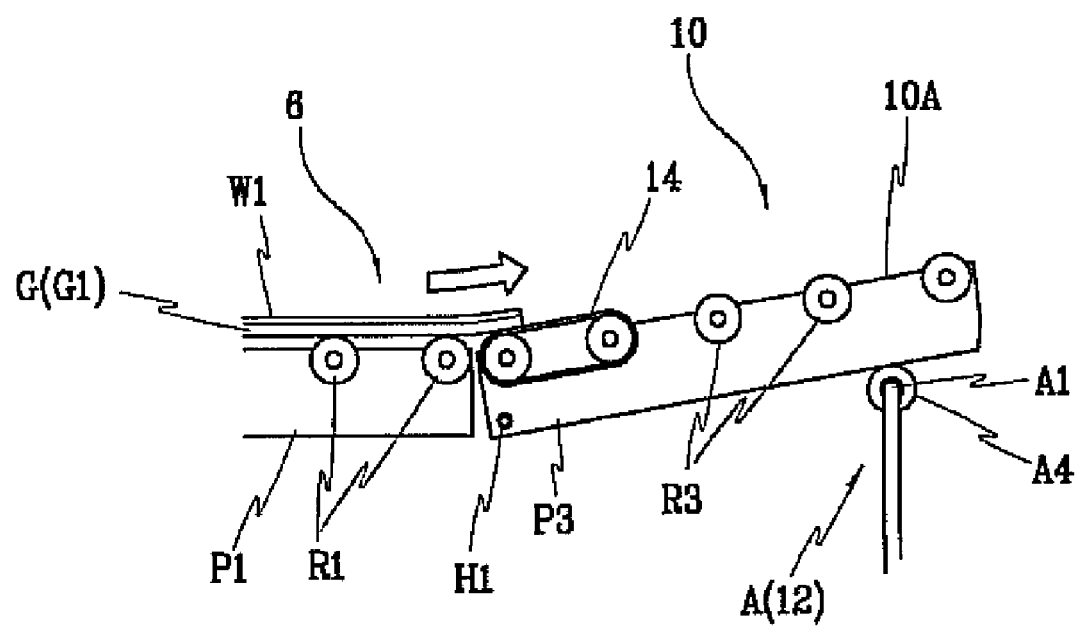
FIGS. 10 to 11 are schematic views illustrating a structure and operation of a guide belt of a substrate transfer apparatus according to an embodiment of the present invention.

That is, as shown in FIG. 10, the transfer guide member 14 is installed to interconnect a plurality of the transfer rollers R3, which are adjacent to an end of the first transfer unit 6, among the transfer rollers R3 of the first variable transfer unit 10A.

Alternatively, the transfer guide member 14 may be installed near the second transfer unit 8 corresponding to the second variable transfer unit 10B of the third transfer unit 10.

Figure 11:
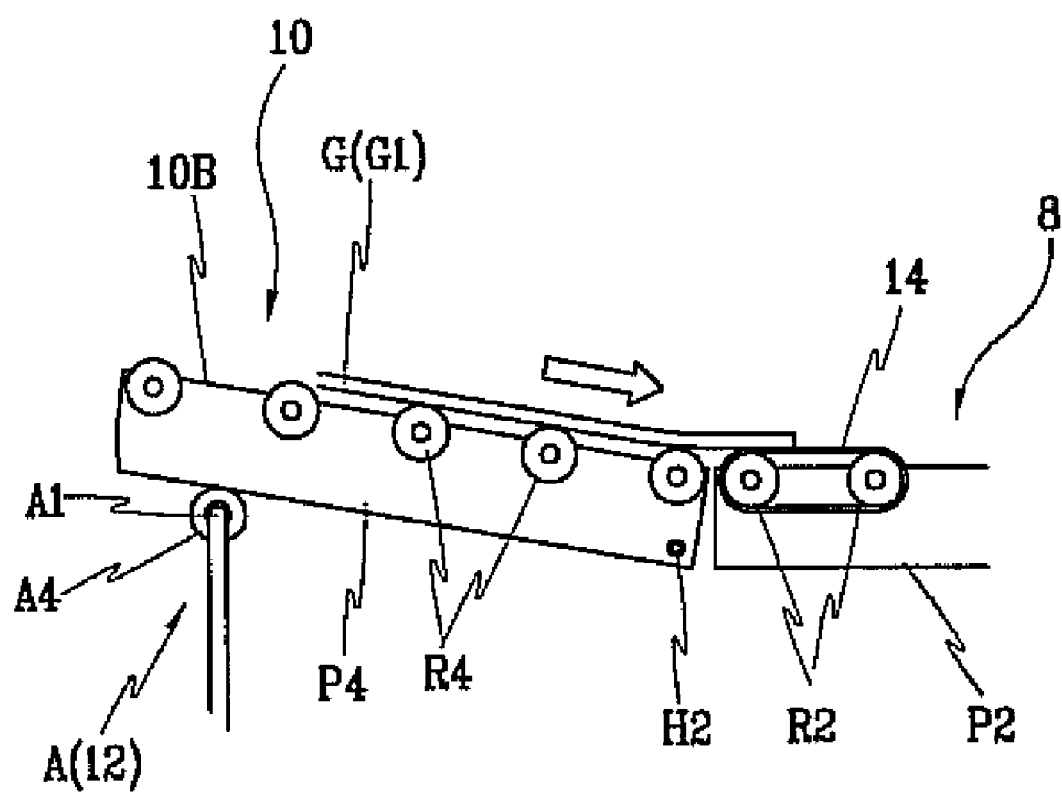

That is, as shown in FIG. 11, the transfer guide member 14 is installed to interconnect a plurality of the transfer rollers R2, which are adjacent to an end of the second variable transfer unit 10B, among the transfer rollers R2 of the second transfer unit 8.

According to the above-described structure, when the substrate G goes into or comes out of the third transfer unit 10, the substrate G is not put between or is not in contact with the transfer rollers R3 and R2 but is smoothly transferred while being guided by the transfer guide member 14.

Therefore, a phenomenon where the substrate G is damaged (deformed) and its normal position is changed and thus the substrate G is transferred in an abnormal state can be prevented.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A substrate transfer apparatus comprising:
   a first transfer unit for transferring a substrate;
   a second transfer unit spaced apart from an end of the first transfer unit;
   a third transfer unit disposed between the first and second transfer units and providing an inclined transfer that is capable of saving a developing solution adhered to the substrate during transfer of the substrate; and
   a transfer controller for controlling an inclined transfer angle and a connection state of the third transfer unit.

2. The substrate transfer apparatus of claim 1, wherein the first transfer unit is provided in the form of a roller conveyer type having a plurality of transfer rollers, and is set to transfer the substrate from a first inner-side of a chamber unit in which the developing solution is supplied to the substrate to a second inner-side of the chamber.

3. The substrate transfer apparatus of claim 1, wherein the second transfer unit is provided in the form of a roller conveyer type having a plurality of transfer rollers, and is set to transfer the substrate from a first inner-side of a chamber unit in which a cleaning solution is supplied to the substrate to a second inner-side of the chamber.

4. The substrate transfer apparatus of claim 1, wherein the first and second transfer units have respective transfer sections that have identical horizontal heights or different horizontal heights.

5. The substrate transfer apparatus of claim 1, wherein the second transfer unit has a transfer section that is higher than a transfer section of the first transfer unit.

6. The substrate transfer apparatus of claim 1, wherein the third transfer unit comprises first and second variable transfer units each of which is provided in the form of a roller conveyor type having a plurality of transfer rollers and has an end that is hinge-coupled between the first and second transfer units.

7. The substrate transfer apparatus of claim 6, wherein the first and second variable transfer units are set to provide variable transfer sections both of which are inclined upward or are inclined upward and downward, respectively, while pivoting about respective hinge coupling points.

8. The substrate transfer apparatus of claim 1, wherein the transfer controller comprises:
   a driving source generating power; and
   a push arm that supports a lower portion of the third transfer unit to be capable of pushing the lower portion of the third transfer unit while being moved up and down by the driving source.

9. The substrate transfer apparatus of claim 8, wherein the driving source is selected from the group consisting of a motor, a cylinder, and a step motor.

10. The substrate transfer apparatus of claim 8, wherein the push arm is set to move up and down by receiving power through cam motion, link motion, or screw-coupling when the driving source is driven.

11. The substrate transfer apparatus of claim 8, wherein the push arm comprises two support ends corresponding to the third transfer unit and a connection end corresponding to the driving source, and
   the push arm is set such that the two support ends individually or commonly move up and down through cam motion of the connection end on an inclined cam surface of a cam that moves forward and rearward when the driving source is driven.

12. The substrate transfer apparatus of claim 8, wherein the push arm comprises two support ends corresponding to the third transfer unit and a connection end corresponding to the driving source; and
   the push arm is set to be capable of individually or commonly moving up and down through link motion of the connection end by a line that pivots at a predetermined angle when the driving source is driven.

13. The substrate transfer apparatus of claim 8, wherein the push arm comprises two support ends corresponding to the third transfer unit and a connection end corresponding to the driving source, and
   an end of a screw is connected to be capable of rotating about an axis of the driving source and penetrates through a side and the two support ends are set to be capable of individually and commonly moving up and down by screw-coupling and forward/reverse rotation of the screw.

14. The substrate transfer apparatus of claim 1, wherein the transfer controller is designed to control the inclined angle and connection state of the third transfer unit while pivoting the third transfer unit through a pushing operation.

15. The substrate transfer apparatus of claim 1, further comprising a transfer guide member for guiding the transfer of the substrate, wherein the transfer guide member is one of a rubber belt or a rubber ring and is installed to interconnect some sections in an entire transfer section defined by the first, second, and third transfer units.

* * * * *